US012701842B2

(12) United States Patent
Garner et al.

(10) Patent No.: US 12,701,842 B2
(45) Date of Patent: Aug. 4, 2026

(54) MULTI-INK LAYERED PRINTED ELECTRODE FOR WRAP AROUND ELECTRODES

(71) Applicant: CORNING INCORPORATED, Corning, NY (US)

(72) Inventors: Sean Matthew Garner, Elmira, NY (US); Sijan Khan, Ithaca, NY (US); Richard Curwood Peterson, Elmira Heights, NY (US); Lu Zhang, Taipei (TW); Ying Zheng, Horseheads, NY (US)

(73) Assignee: CORNING INCORPORATED, Corning, NY (US)

( * ) Notice: Subject to any disclaimer, the term of this patent is extended or adjusted under 35 U.S.C. 154(b) by 393 days.

(21) Appl. No.: 18/579,026

(22) PCT Filed: Jul. 8, 2022

(86) PCT No.: PCT/US2022/036486
§ 371 (c)(1),
(2) Date: Jan. 12, 2024

(87) PCT Pub. No.: WO2023/287652
PCT Pub. Date: Jan. 19, 2023

(65) Prior Publication Data
US 2024/0322101 A1     Sep. 26, 2024

Related U.S. Application Data

(60) Provisional application No. 63/222,215, filed on Jul. 15, 2021.

(51) Int. Cl.
H01L 33/62 (2010.01)
H01L 25/075 (2006.01)
(Continued)

(52) U.S. Cl.
CPC .......... H10H 20/857 (2025.01); H10W 90/00 (2026.01); *H10H 20/0364* (2025.01)

(58) Field of Classification Search
CPC .. H10H 20/857; H10H 20/0364; H10W 90/00
See application file for complete search history.

(56) References Cited

U.S. PATENT DOCUMENTS 9,647,362 B2     5/2017  Tatzel
2004/0247842 A1*  12/2004  Koyama  .............. H05K 3/1208
427/96.1
(Continued)

FOREIGN PATENT DOCUMENTS

CN          104284952 A     1/2015
KR     10-2015-0006091 A     1/2015
(Continued)

OTHER PUBLICATIONS

International Search Report and Written Opinion of the International Searching Authority; PCT/US2022/036486; dated Nov. 7, 2022; 9 pages; Korean Patent Office.
(Continued)

*Primary Examiner* — Peniel M Gumedzoe
(74) *Attorney, Agent, or Firm* — Ryan T. Hardee; Grant A. Gildehaus

(57) ABSTRACT

In the present invention, metal nanoparticles are obtained by subjecting a composition for manufacturing metal nanoparticles to a thermal reaction, the composition including (A) a metal oxalate, (B) an amine compound, and (C) a hydroxy fatty acid. The metal nanoparticles are readily dispersed in a polar solvent or a solvent mixture having a high ratio of a polar solvent.

26 Claims, 2 Drawing Sheets

(51) Int. Cl.

| | | |
|---|---|---|
| *H01L 25/16* | (2023.01) | |
| *H10H 20/857* | (2025.01) | |
| *H10W 90/00* | (2026.01) | |
| *H10H 20/01* | (2025.01) | |

(56) References Cited

U.S. PATENT DOCUMENTS

| | | | | |
|---|---|---|---|---|
| 2006/0163744 | A1* | 7/2006 | Vanheusden | B82Y 30/00 |
| | | | | 257/E21.174 |
| 2014/0091909 | A1* | 4/2014 | Smith | H01G 4/40 |
| | | | | 29/25.42 |
| 2015/0056426 | A1 | 2/2015 | Grouchko et al. | |
| 2015/0189761 | A1 | 7/2015 | Chan et al. | |
| 2016/0234943 | A1* | 8/2016 | Chung | H05K 1/0274 |

FOREIGN PATENT DOCUMENTS

| | | |
|---|---|---|
| KR | 10-2015-0077676 A | 7/2015 |
| KR | 10-2016-0135892 A | 11/2016 |
| KR | 10-2020-0145809 A | 12/2020 |
| TW | 201710416 A | 3/2017 |
| WO | 2016/204105 A1 | 12/2016 |

OTHER PUBLICATIONS

Pastel et al., 'Wrap-around electrodes for microLED tiled displays', Journal of the Society for Information Display, vol. 28, Issue 6, 2020, pp. 463-468.

Taiwanese Patent Application No. 111126476 , Office Action dated Jan. 9, 2026, 2 pages (English Translation only), Taiwanese Patent Office.

Y. Li, et al., "Improved Electrical Performance of Low-Temperature-Cured Silver Electrode for Silicon Heterojunction Solar Cells", IEEE Journal of Photovoltaics, vol. 8, No. 4, pp. 969-975, Jul. 2018.

Korean Patent Application No. 10-2024-7005351, Office Action dated Feb. 9, 2026, 6 pages (English Translation only), Korean Patent Office.

\* cited by examiner

MULTI-INK LAYERED PRINTED ELECTRODE FOR WRAP AROUND ELECTRODES

CROSS-REFERENCE TO RELATED APPLICATIONS

This application is a national stage entry of International Patent Application Serial No. PCT/US2022/036486, filed on Jul. 8, 2022, which in turn, claims the benefit of priority under 35 U.S.C. § 119 of U.S. Provisional Application Ser. No. 63/222,215 filed on Jul. 15, 2021, the contents of each of which are relied upon and incorporated herein by reference in their entireties.

BACKGROUND

Field of the Disclosure

The present disclosure relates to the technology of edge electrodes for microLED electronic displays. More specifically, the present disclosure relates to borderless, bezel free, or tiled displays.

Description of the Related Art

MicroLED displays consist of arrays of microscopic light-emitting diodes (LEDs) defining individual pixel elements. Top emission microLED displays require a method to electrically interconnect the microLEDs on a substrate top surface with a driver board located behind the substrate. Typically, this is accomplished by using a flexible connector attached at the edge of the top surface of the substrate and bent around the substrate. In a case of a borderless, bezel free, or tiled display, it is not desirable to use a flexible connector attached to the substrate top surface. In such a configuration, the flexible connector is either visible to the viewer and then needs to be hidden by a bezel, or the flexible connector occupies too much space between tiles and prohibits seamless tiling. In both cases, the typical flexible connector is too big to meet requirements of being invisible to the viewer while providing tight assembly packaging. One solution to electrically connect the top surface of the microLED display substrate with the driver board behind is to use wrap around electrodes. An example, is shown in FIG. 1.

FIG. 1 shows an edge portion of a substrate 10 including a microLED array 20 on a front surface of the substrate 10. A contact pad for a microLED electrode 30 extends from the microLED array 20 and is connected to a contact pad for a rear surface electrode 50 via a wraparound electrode (WAE) 40. As shown, the WAE is fabricated to wrap around the edge of the microLED display substrate 10. This allows the electrodes to occupy less physical space and be less visibly observable. WAEs have been used with borderless, bezel free, and tiled displays. These electrodes have been constructed with various electrode materials and fabrication methods. Such techniques include: printed lines, vacuum deposited/patterned metal lines, flexible connectors, and electroplated lines. Although success in demonstrating functional microLED displays has been achieved, the microLED displays shown have been limited in brightness and life time. This limited operation is assumed to be due to the currently used WAE electrical performance and reliability. Methods to improve WAE electrical performance and reliability are being made through material and process improvements.

Electrode printing can be performed by depositing conductive metal nanoparticle ink onto a tiled substrate in a pre-determined pattern, which is then consolidated under mild temperatures to sinter metal particles to provide an electrically conductive path. Sintering removes the ink solvents and disrupts organic materials provided to isolate the nanoparticles so that the metals of adjacent nanoparticles can make contact and bond together.

Electrode printing provides a low cost 3D solution in comparison to incumbent sputtering technologies because of its relative high thickness and the 3D patterning required to create a wraparound electrode. In an example printing process, the nanoparticle ink is delivered to a nozzle that directs the ink onto the substrate in the desired pattern. The deposited ink is then dried and consolidated at a relatively low temperature i.e., ≤250° C. A protective coating, typically a polymer, is then applied to the substrate to provide mechanical protection and electrical isolation for the electrode and to optically hide the electrodes at the edge of the substrate. An example of two tiled substrates with microLED displays with this type of configuration is shown in FIG. 2.

FIG. 2 shows two adjacent microLED displays similar to the one shown in FIG. 1. As shown, each microLED display includes a substrate 10 including a microLED array 20 on a front surface of the substrate 10. A microLED electrode 30 extends from the microLED array 20 and is connected to a rear surface electrode 50 via a WAE 40. A protective coating 60 is included to cover and protect the WAEs 40 at the sides and front and back surfaces of the substrates 10.

The electrical resistance of the printed electrodes can be as low as 2.5× bulk conductor material resistivity, which depends on the size of the nanoparticles used, the consolidation condition, and the organic composition of the ink. Specifically, as the average size of the nanoparticles are reduced, the resistivity of the printed electrodes is reduced. As a result, smaller nanoparticles are preferred. However, to prevent the agglomeration of nanoparticles in the ink suspension, nanoparticles are surrounded with organic coatings that help repel nanoparticles from each other, reducing unwanted precipitation.

The organic coatings of the nanoparticles can create several problems for the printed electrodes if they are not removed during the consolidation process. The problems can include: (a) Affecting the electrical performance as resulting porosity increases the line resistance and the contact resistance; (b) Increasing the contact resistance between the printed electrode and the contact pad if not removed completely; (c) Decreasing the reliability of the printed line from trapped organics that evolve over time or moisture that is trapped in the pore space of the printed line; and (d) Reducing the rate and degree of consolidation as the sintering needs to break down these coatings so that metals of adjacent nanoparticles can fuse together.

While contact resistance of nanoparticle inks to conductive contacts of electrodes are not very high if the contact area is large, as the size of the display pixels shrink in size, the corresponding contact area shrinks. As a result, total resistance of the WAE is often dominated by contact resistance for microLED displays.

SUMMARY

To overcome the problems described above, preferred embodiments of the present disclosure provides a process including several steps of singulating individual microLED display substrate components (tiles) from a sheet to tile sizing/shaping, edge preparation, electrode printing, and applying a protective coating.

This disclosure addresses the contact resistance limitations of printed electrodes using nanoparticle ink. Reduction of contact resistance is achieved by incorporating at least one additional layer that specifically increases the electrical contact between the printed WAEs and an electrode contact pad. Using the individual printed layers by themselves does not meet the device electrical requirements. Providing printed layers combined in a multi-layer structure, though, does meet the requirements.

Disclosed are new methods and compositions for printing electrodes to reduce contact resistance. The methods include deposition of two or more conductive inks. At least one layer is designed to establish good electrical contact and low contact resistance between the device electrode and the printed electrode. This layer can include a metal precursor ink composed of metal compounds that improves contact between the printed electrode and a nanoparticle metal ink. An additional layer is designed to establish low line resistance of the printed electrodes. This layer can be composed of traditional nanoparticle conductive inks which may be deposited with increased thickness than can be deposited by a metal precursor ink alone, thereby increasing printing throughput.

The combination of the multiple layers, when consolidated together, uniquely generates a film with low contact resistance to contact pads, low metal line resistance, and high adhesion to the deposited substrate and contact pad material.

This disclosure includes several innovations utilizing various compositions, processes, and methods to print conductive electrodes. These innovations achieve both low contact resistance and low line resistance of wrap around electrodes. The innovations include:

1) A multi-layer printed electrode
2) A process flow of a multi-component ink system
3) Utilization of a metal precursor ink that metallizes after deposition
4) A process of nanoparticle ink deposition and methods of consolidating the multi-layer printed electrode
5) Explanation of how a multi-ink solution is advantageous over the nanoparticle only printed electrode and the metal compound only printed electrode, including:
   a) Increasing contact with contact pads
   b) Maximizing thickness of the printed electrode stack, thereby reducing cost
   c) Mitigating oxidation of the printed metal electrodes or the contact pad material An embodiment of the current disclosure includes a method of manufacturing an electrode including printing a metal precursor ink onto a contact pad on a substrate; drying the metal precursor ink; printing a nanoparticle ink on the metal precursor ink; and consolidating the metal precursor ink and the nanoparticle ink such that metal from the precursor ink and metal from the nanoparticle ink fuse together.

In the embodiment, the steps of printing the metal precursor ink and printing the nanoparticle ink can be performed by one of an aerosol printer, a pad printer, an ink jet printer, and a spray printer.

In the embodiment, the step of drying the metal precursor ink can be under ambient conditions.

In the embodiment, the step of consolidating the metal precursor ink and the nanoparticle ink can be at a temperature of less than or equal to 250° C.

In the embodiment, the contact pad can include two contact pads, one being a display contact pad extending from a microLED array on the substrate and one being a rear surface contact pad on an opposite side of the substrate from the microLED array.

The method can further include the step of providing a wraparound electrode to contact both the display contact pad and the rear surface contact pad.

In the embodiment, the substrate can be glass.

In the embodiment, a metal in the metal precursor ink and in the nanoparticle ink can be silver or copper.

In the embodiment, a metal in the metal precursor ink and a metal in in the nanoparticle ink can be the same.

In the embodiment, a metal in the metal precursor ink and a metal in in the nanoparticle ink can be different.

In the embodiment, the step of consolidating the metal precursor ink and the nanoparticle ink can be performed using a laser.

In the embodiment, the step of drying the metal precursor ink can be performed at a temperature up to 150° C.

In another embodiment of the current disclosure, an array substrate includes a substrate; a microLED array on a front surface of the substrate and including a display contact pad; a metal precursor ink directly on and electrically contacting the display contact pad; and a nanoparticle ink directly on and electrically contacting the metal precursor ink on the display contact pad.

The array substrate can further include a rear surface contact pad on a rear surface of the substrate opposite to the front surface; the metal precursor ink electrically contacting the rear surface contact pad; and the nanoparticle ink electrically contacting the metal precursor ink on the rear surface contact pad.

The array substrate can further include a wraparound electrode to contact the nanoparticle ink on the display contact pad and the rear surface contact pad.

In another embodiment of the current disclosure, an electrode includes a metal precursor ink electrically contacting a contact pad; and a nanoparticle ink electrically contacting the metal precursor ink on the contact pad.

The above and other features, elements, characteristics, steps, and advantages of the present disclosure will become more apparent from the following detailed description of preferred embodiments of the present disclosure with reference to the attached drawings.

DETAILED DESCRIPTION OF PREFERRED EMBODIMENTS

Figure 1:
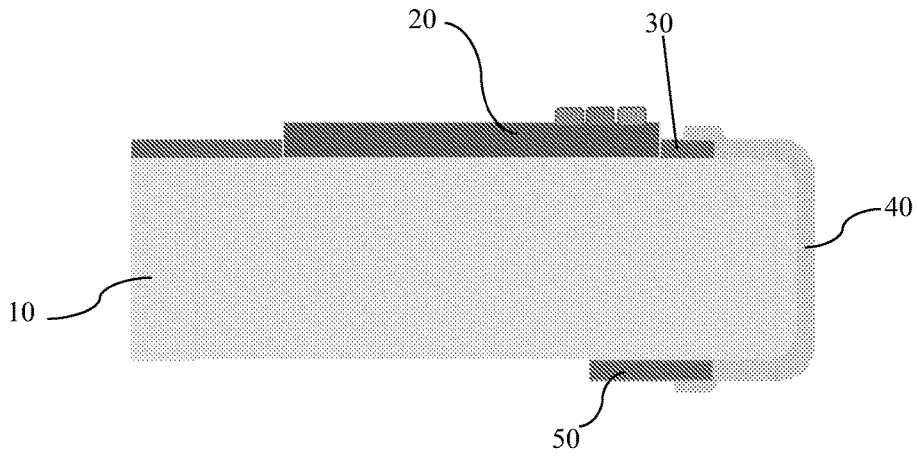
FIG. 1 is a cross-section diagram of a microLED display according to the related art.
Figure 2:
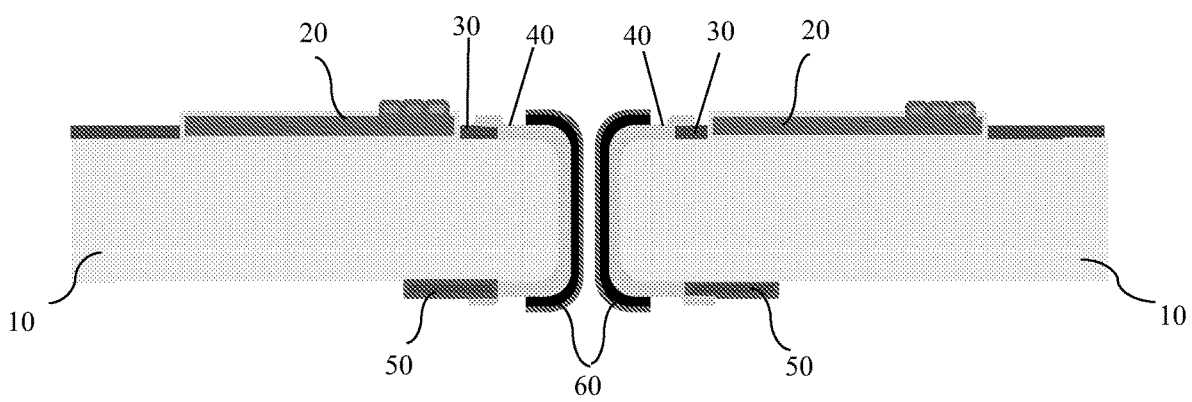
FIG. 2 is a cross-section diagram of two adjacent microLED displays according to the related art.
Figure 3:
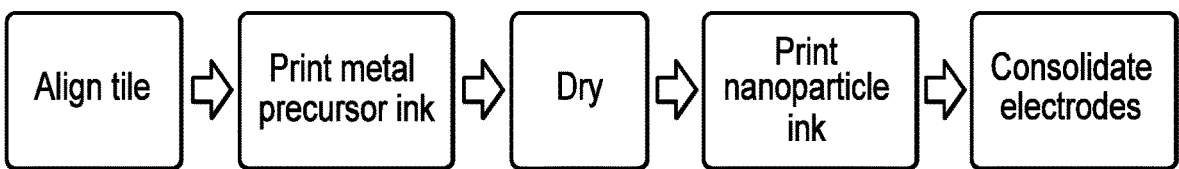
FIG. 3 shows a process flow according to an embodiment of the present disclosure.

FIG. 3 illustrates a process of printing a multi-layer ink system according to an embodiment of the present disclosure. In this embodiment: 1) at least one layer is optimized to establish a strong electrical contact between a contact pad and a printed electrode, and 2) at least one layer is optimized to establish low line resistance. Although more than two layers are possible, the specific examples below focus on a minimum two-layer electrode system.

According to the process shown in FIG. 3, first a tiled substrate is set on a stage of a printer and aligned. The printer can use an aerosol jet, ink jet, spray, screen, roller, slot, stamp, pad, blade, or any other suitable technology to deposit the desired inks on a substrate. Also, different solution coating or printing methods can be used to deposit the different ink layers as appropriate for the specific ink properties and the desired layer structure and dimensions. Next, a metal precursor ink is printed in a desirable pattern to establish an electrode. The metal precursor ink is composed of metal compounds that are solubilized in solution, and can include a cationic metal, such as silver, copper, gold, aluminum, nickel or other metal, along with an anionic species, such as acetates, nitrates, sulfates, or any other species that readily forms a salt in solution. The salt can be dispersed in either an aqueous solvent, or an organic solvent. It is desirable for the solvent system to be composed of binary, ternary, or even higher order mixture of solvents to produce the physical and chemical properties desirable for printing.

Next, the metal precursor ink is dried. Depending on the metal precursor ink used, drying can be performed in ambient conditions or accelerated by heating. Heating the substrate and/or ink up to 150° C. can be used to modify the solvent evaporation rate to control printed electrode dimensions such as line width and thickness. Once the metal precursor line is sufficiently dried, additional layers can be printed with the same ink or different ink to achieve the desired electrical and physical properties.

As the metal precursor ink is being printed, the solvents evaporate, increasing the concentration of the metal salt. This results in a metallization reaction where the metal is reduced to form metal nuclei that grows in size and precipitates out of the solution to form a solid metal film. The biproducts of the reaction are generally gaseous or volatile. Heat may be used to initiate or accelerate the metallization process and drive off the biproducts of the redox reaction from the printed electrode. This may be done under air, inert, or reducing atmospheres (a reducing atmosphere being one including a reducing agent, such as hydrogen gas, to keep the contact pad and/or the printed electrodes from oxidizing) depending on the metal selected to minimize oxidation. The metal precursor ink is can be composed of acidic and/or basic components that can react to reduce the surface oxide on the contact pads of the microLED display electrode and rear surface electrode further aiding in obtaining low contact resistance between conductive contacts. The resulting film is a solid metal electrode that is composed of particle-like morphologies, web-like or stranded structures of metal fused within the precursor. The deposited metal electrode is conformal to the substrate and underlying electrical structures resulting in improved electrical contact between the printed electrode and the front and rear contact pads. Note that although microLED displays are specifically described, this multi-ink electrode that achieves both low contact resistance and low line resistance can be applied generally to other electronic and opto-electronic applications. Devices in these applications can utilize this multi-ink electrode either as surface conductors or WAE as described. These applications can include display technologies (LCD and OLED), photovoltaic, lighting, sensors, and flexible electronics.

After the "contact resistance layer" of metal precursor is created, an additional layer is defined that creates low line resistance. After drying the metal precursor ink, a nanoparticle metal ink is deposited on top of the partially or fully metalized precursor ink to achieve the desired printed electrode dimensions. Depending on process conditions, the metal precursor ink may not be fully sintered with all the metal fused.

The two-layer printed electrode is then consolidated using heat, laser, UV, IR, or any other suitable mechanism at a temperature of ≤250° C. The consolidation can be performed under a different atmosphere as dictated by the metal selection of the inks used for the printing to prevent oxidation. For example, consolidation can be performed under any suitable combination of temperature, pressure, and gas. This consolidation step serves several functions. In the nanoparticle ink, consolidation drives off the solvents, disrupts the binders surrounding the nanoparticles that inhibit sintering, and sinters the nanoparticles sufficiently to generate electrical continuity within the nanoparticle layer. In the metallized precursor layer, the consolidation process can complete any additional metallization of the metal precursor ink. The consolidation also provides sintering and fusion of the metals between the metal precursor layer and the nanoparticle layer. Although before consolidation the precursor ink and nanoparticle ink can be separate layers, during consolidation the layers can combine into a single conductive structure. Depending on the consolidation conditions and ink components, the resulting multiple layers can have differing porosity and microstructures, or the multiple layers can combine to become a resulting single conductor structure without distinctive boundaries. While a printed electrode of two-layers is preferred, any amount of layers can be provided to achieve the desirable performance characteristics. Also, the ink layers do not need to be continuous within the patterned area. For example the "contact resistance layer" or other layer can be discontinuous islands above the device electrode contact pad.

The metal constituents of the inks (metal precursor and nanoparticle) can be the same, for example, gold, silver, copper, nickel, tin, etc., but can be different to further expand performance attributes (i.e., electrical performance, adhesion, reliability, etc.) of the printed multi-ink layered electrode. The metal selection(s) and consolidation process need to be sufficiently compatible to produce the desired performance.

Figure 4:
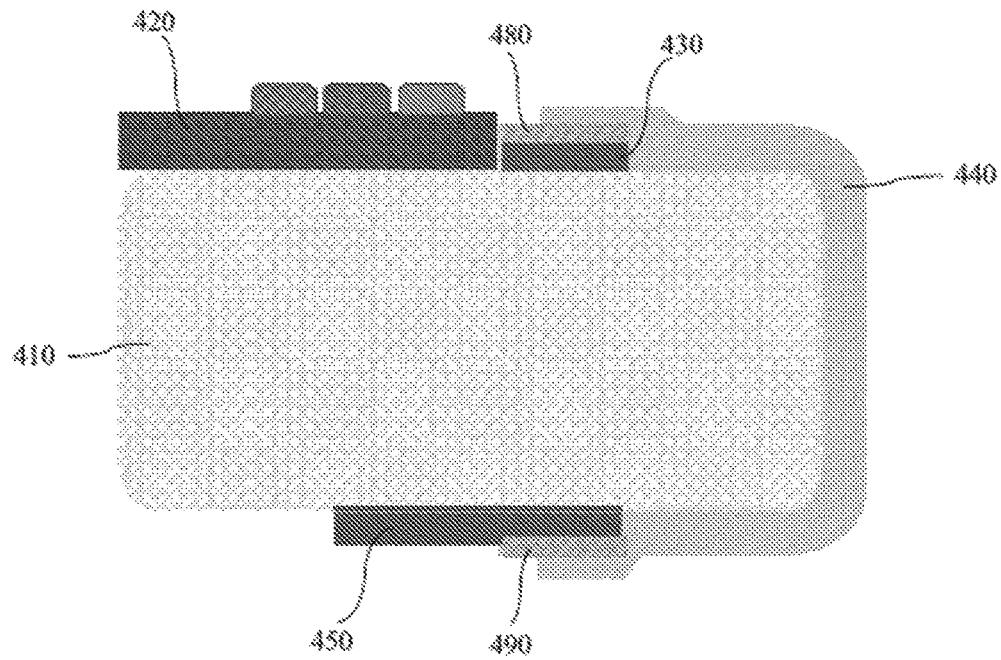
FIG. 4 is a cross-section diagram of a microLED display according to the present disclosure.

A resulting two-ink electrode configuration is shown in FIG. 4. FIG. 4 shows a microLED array 420 including an electrode 430 on a front surface of a substrate 410. The substrate 410 can be glass, ceramic, glass-ceramic, polymer, composite, metal, an alloy, any combination thereof, or any other suitable material. A rear surface electrode 450 can be on the rear surface of the substrate 410. Consolidated layers defining two-ink electrodes 480 and 490 of the metal precursor ink and the nanoparticle ink generated according to the process described above with respect to FIG. 3 can be provided on the microLED electrode 430 and the rear surface electrode 450, respectively. As shown, a conventional WAE 440 is used to connect the two-ink electrodes 480 and 490. Alternatively, the nanoparticle ink layer can be extended to define the continuous WAE 440.

The two ink printing system has additional advantages for wrap around electrodes applications. While a single metal compound based precursor printed electrode system can be used to produce electrodes of similar geometry with low contact resistance, metal compound inks are limited by the thickness that can be deposited in a single pass. This is because the metal fraction of the ink is limited by the solubility limit of the silver compound in the solvent system. Whereas commercial metal nanoparticle inks can contain 50-70 wt % of metal, most commercial metal compound inks contain less than 20 wt % of metal and is very fluid, resulting in wide and short print patterns. As a result, it might be necessary to print up to 20 layers of metal compound inks to generate an equivalent thickness that can be achieved with a single pass of nanoparticle ink. In addition, the deposited metal compound inks are more textured than their nanoparticle counterparts so they often exhibit worse conductivity than their nanoparticle counterparts, even if nanoparticle inks contain higher porosity. Thus, combining the two types of metal inks together generates superior performance than their individual components. Performance of different electrode materials is shown in Table 1.

| Metal Electrode | Contact Material | Contact Resistivity ($\Omega \cdot \mu m^2$) |
|---|---|---|
| Ag NP only | Ti/Cu/ITO | 100,000-500,000 |
| Ag Precursor + Ag NP | Ti/Cu/ITO | 14,000 |

Table 1 shows a resistivity of only a silver based nanoparticle ink (NP) on a Ti/Cu/ITO contact material to be 100,000-500,000 $\Omega \cdot \mu m^2$. On the other hand, the resistivity of the silver based nanoparticle ink on top of a silver based precursor has a significantly lower resistivity of 14,000 $\Omega \cdot \mu m^2$.

The multi-ink layer printed electrode approach allows the different metal inks to be printed in different electrode patterns to addresses localized performance needs as desired. The metal precursor ink can be printed just over the contact pads, or throughout the entire printed electrode pattern. Similarly, the metal nanoparticle ink can be printed locally over the metal precursor ink or throughout the entire printed electrode pattern. The choice of the print pattern for the metal compound ink depends on the exact dimensions to be patterned, the capabilities of the printing equipment, and other considerations such as the step height in the contact pad material. For example, the metal precursor ink pattern (or other ink layers) can be completely covered by the metal compound ink pattern (or other layers). Alternatively, the metal precursor ink or any other underlying layer can extend out from under the metal compound ink or upper layers and be non-covered. In this way, any of the individual layers can have different widths, lengths, and thickness as long as they overlap and electrically connect.

It should be understood that the foregoing description is only illustrative of the present disclosure. Various alternatives and modifications can be devised by those skilled in the art without departing from the present invention. Accordingly, the present disclosure is intended to embrace all such alternatives, modifications, and variances that fall within the scope of the appended claims.

What is claimed is:

1. A method of manufacturing an electrode, the method comprising:
   printing a metal precursor ink onto a contact pad on a substrate;
   drying the metal precursor ink;
   printing a nanoparticle ink on the metal precursor ink; and
   consolidating the metal precursor ink and the nanoparticle ink such that metal from the precursor ink and metal from the nanoparticle ink fuse together.

2. The method of claim 1, wherein the steps of printing the metal precursor ink and printing the nanoparticle ink are performed by one of an aerosol printer, a pad printer, an ink jet printer, and a spray printer.

3. The method of claim 1, wherein the step of drying the metal precursor ink is under ambient conditions.

4. The method of claim 1, wherein the step of drying the metal precursor ink is performed at a temperature up to 150° C.

5. The method of claim 1, wherein the step of consolidating the metal precursor ink and the nanoparticle ink is at a temperature of less than or equal to 250° C.

6. The method of claim 1, wherein the step of consolidating the metal precursor ink and the nanoparticle ink is performed using a laser.

7. The method of claim 1, wherein the contact pad includes two contact pads, one being a display contact pad extending from a microLED array on the substrate and one being a rear surface contact pad on an opposite side of the substrate from the microLED array.

8. The method of claim 7, further comprising the step of providing a wraparound electrode to contact both the display contact pad and the rear surface contact pad.

9. The method of claim 1, wherein the substrate is glass.

10. The method of claim 1, wherein a metal in the metal precursor ink and in the nanoparticle ink is silver.

11. The method of claim 1, wherein a metal in the metal precursor ink and in the nanoparticle ink is copper.

12. The method of claim 1, wherein a metal in the metal precursor ink and a metal in in the nanoparticle ink are the same.

13. The method of claim 1, wherein a metal in the metal precursor ink and a metal in in the nanoparticle ink are different.

14. An array substrate comprising:
   a substrate;
   a microLED array on a front surface of the substrate and including a display contact pad;
   a metal precursor ink electrically contacting the display contact pad; and
   a nanoparticle ink electrically contacting the metal precursor ink on the display contact pad.

15. The array substrate of claim 14, further comprising:
   a rear surface contact pad on a rear surface of the substrate opposite to the front surface;
   the metal precursor ink electrically contacting the rear surface contact pad; and
   the nanoparticle ink electrically contacting the metal precursor ink on the rear surface contact pad.

16. The array substrate of claim 15, further comprising a wraparound electrode to contact the nanoparticle ink on the display contact pad and the rear surface contact pad.

17. The array substrate of claim 14, wherein a metal in the metal precursor ink and in the nanoparticle ink is silver.

18. The array substrate of claim 14, wherein a metal in the metal precursor ink and in the nanoparticle ink is copper.

19. The array substrate of claim 14, wherein the substrate is glass.

20. The array substrate of claim 14, wherein a metal in the metal precursor ink and a metal in in the nanoparticle ink are the same.

21. The array substrate of claim 14, wherein a metal in the metal precursor ink and a metal in in the nanoparticle ink are different.

22. An electrode comprising:
   a metal precursor ink electrically contacting a contact pad; and
   a nanoparticle ink electrically contacting the metal precursor ink on the contact pad.

23. The electrode of claim 22, wherein a metal in the metal precursor ink and in the nanoparticle ink is silver.

24. The electrode of claim 22, wherein a metal in the metal precursor ink and in the nanoparticle ink is copper.

25. The electrode of claim 22, wherein a metal in the metal precursor ink and a metal in in the nanoparticle ink are the same.

26. The electrode of claim 22, wherein a metal in the metal precursor ink and a metal in in the nanoparticle ink are different.

\* \* \* \* \*